United States Patent
Kim

(10) Patent No.: US 7,626,199 B2
(45) Date of Patent: Dec. 1, 2009

(54) ORGANIC LIGHT EMITTING DIODE DISPLAY

(75) Inventor: Jong-Yun Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 79 days.

(21) Appl. No.: 11/923,917

(22) Filed: Oct. 25, 2007

(65) Prior Publication Data

US 2008/0246026 A1 Oct. 9, 2008

(30) Foreign Application Priority Data

Apr. 5, 2007 (KR) .................. 10-2007-0033745

(51) Int. Cl.
*H01L 51/00* (2006.01)
*H01J 63/04* (2006.01)

(52) U.S. Cl. .................. 257/40; 257/72; 313/504; 345/76

(58) Field of Classification Search .......... 257/40, 257/88, 72, E51.019, E27.111, E27.113; 313/504, 506, 503; 345/76, 36, 55, 77, 80, 345/87, 90

See application file for complete search history.

(56) References Cited

U.S. PATENT DOCUMENTS 6,777,710 B1 * 8/2004 Koyama .................. 257/59
2005/0258466 A1 * 11/2005 Kwak et al. ............. 257/306

FOREIGN PATENT DOCUMENTS

| KR | 2000-13840 | 3/2000 |
|---|---|---|
| KR | 2003-35219 | 5/2003 |
| KR | 2003-54795 | 7/2003 |
| KR | 2003-58148 | 7/2003 |
| KR | 2005-111922 | 11/2005 |
| KR | 2006-848 | 1/2006 |

* cited by examiner

*Primary Examiner*—Thomas L Dickey
*Assistant Examiner*—Nikolay Yushin
(74) *Attorney, Agent, or Firm*—Stein McEwen, LLP

(57) ABSTRACT

An organic light emitting diode display includes a substrate on which a transistor area and a capacitor area are defined, a semiconductor layer formed at the transistor area, and a capacitor having a plurality of electrodes. The plurality of electrodes include a first electrode, a second electrode that is disposed on the first electrode with an insulation layer formed between the first and second electrodes, and a third electrode that is disposed on the second electrode with an insulation layer formed between the second and third electrodes and connected to the first electrode through at least two contact holes.

16 Claims, 4 Drawing Sheets

ORGANIC LIGHT EMITTING DIODE DISPLAY

CROSS-REFERENCE TO RELATED APPLICATION

This application claims the benefit of Korean Application No. 2007-33745 filed Apr. 5, 2007, in the Korean Intellectual Property Office, the disclosure of which is incorporated herein by reference.

BACKGROUND OF THE INVENTION

1. Field of the Invention

Aspects of the present invention relate to an organic light emitting diode (OLED) display. More particularly, aspects of the present invention relate to an OLED display in which a contact error of a dual-capacitor can be prevented.

2. Description of the Related Art

When electrons and holes are injected in an organic material through an anode and a cathode, excitons are formed by a recombination between the electrons and the holes. The excitons emit energy while being transited to a ground state, and light having a specific wavelength is generated by the emitted energy. A self-emissive display using the above property is called an organic light emitting diode (OLED) display.

OLED displays do not require a separate light source such as a backlight, and thus, OLEDs have advantages of reduced power consumption in comparison with other display technologies such as LCDs. Furthermore, since OLED displays provide a wide view angle and have quick responsiveness, OLED displays are gaining prominence as a next generation display.

OLED displays are classified as passive matrix displays and active matrix displays. Recently, the active matrix displays that can realize low power consumption and quick responsiveness have been developed.

In the active matrix OLED display, a pixel area at which an image is actually displayed is formed on a pixel substrate. Metal lines and data and scan drivers that drive the pixel area in response to signals input through pads of the metal lines are formed around the pixel area.

A plurality of pixels, each of which is a basic unit used in displaying the image, are arranged in a matrix pattern at the pixel area. An organic light emitting element is disposed on each pixel. The organic light emitting element includes red, green, and blue organic light emitting layers, and anode and cathode electrodes that are alternately formed between the red, green, and blue organic light emitting layers.

Thin film transistors (TFTs) coupled to the organic light emitting element are formed on each pixel so that the pixels can be independently controlled. The TFTs are classified into switching transistors that transmit switching signals and driving transistors that transmit driving signals to the organic light emitting element.

The pixel circuit may be a 2-transistor type pixel circuit having one switching transistor and one driving transistor. However, with this structure, a threshold voltage deviation is generated within a panel. This causes luminance dispersion. Therefore, a circuit that uses more than two transistors to compensate for the threshold voltage deviation has been proposed.

When more than two transistors are used, a capacitor is generally formed in a dual-structure to increase capacitance. For example, one electrode of the capacitor may be defined by a gate pattern and another electrode of the capacitor may be defined by the connection of an active pattern and a source/drain metal through a contact hole.

However, when the contact hole is not successfully formed due to particles generated during the manufacturing process, the source/drain metal may not be properly connected to the active pattern. In this case, the active electrode cannot function as an electrode of the capacitor and thus, the capacity of the capacitor is significantly reduced to be lower than normal capacity. Furthermore, this causes other collateral problems.

The above information disclosed in this Background section is only for enhancement of understanding of the background of the invention and therefore, it may contain information that does not form the prior art that is already known in this country to a person of ordinary skill in the art.

SUMMARY OF THE INVENTION

Aspects of the present invention provide an OLED display that can improve the display quality by preventing a contact error problem of a capacitor. According to an embodiment of the present invention, an OLED display has a substrate on which a transistor area and a capacitor area are defined, a semiconductor layer formed at the transistor area, and a capacitor having a plurality of electrodes. The plurality of electrodes may include a first electrode and a second electrode disposed on the first electrode with an insulation layer interposed therebetween. The plurality of electrodes may further include a third electrode disposed on the second electrode with an insulation layer interposed therebetween, and connected to the first electrode through at least two contact holes.

According to an aspect of the present invention, the first electrode may be connected to the semiconductor layer formed at the transistor area.

According to an aspect of the present invention, the first electrode may be formed in an active pattern.

According to an aspect of the present invention, the first electrode may be connected to the semiconductor layer formed at the transistor area by an extending pattern.

According to an aspect of the present invention, the semiconductor layer may be included in a transistor coupled between a power source that supplies a power supply voltage and a power source that supplies an initial voltage.

According to an aspect of the present invention, the semiconductor layer connected to the first electrode may be included in a transistor that transmits a data voltage to a driving transistor in response to a selection signal applied from a current scan line.

According to an aspect of the present invention, one of the at least two contact holes may be formed through the capacity area and at least one of the at least two contact holes may be formed through the transistor area.

According to an aspect of the present invention, at least two contact holes may be formed through the transistor area.

According to an aspect of the present invention, the contact holes formed through the transistor area may be formed through a semiconductor layer included in a transistor coupled between a power source that supplies a power source voltage and a power source that supplies an initial voltage.

According to an aspect of the present invention, the contact holes formed through the transistor area may be formed through a transistor that transmits a data voltage to a driving transistor in response to a selection signal applied from a current scan line.

According to an aspect of the present invention, the second electrode may be divided into two sections between which the contact hole formed through the capacitor area is located, and one of the two sections may be connected to a line of the power source and the other of the two sections may be connected to the current scan line.

According to an aspect of the present invention, the one of the two sections of the second electrode, which is connected to the line of the power source, may form a storage capacitor, and the other of the two sections, which is connected to the current scan line, may form a boost capacitor.

According to an aspect of the present invention, the second electrode may include a metal.

According to an aspect of the present invention, the third electrode may be formed to cover the contact hole formed through the transistor area.

According to an aspect of the present invention, the third electrode may include a metal.

According to an aspect of the present invention, six transistors may be formed at the transistor area and two capacitors may be formed at the capacitor area.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
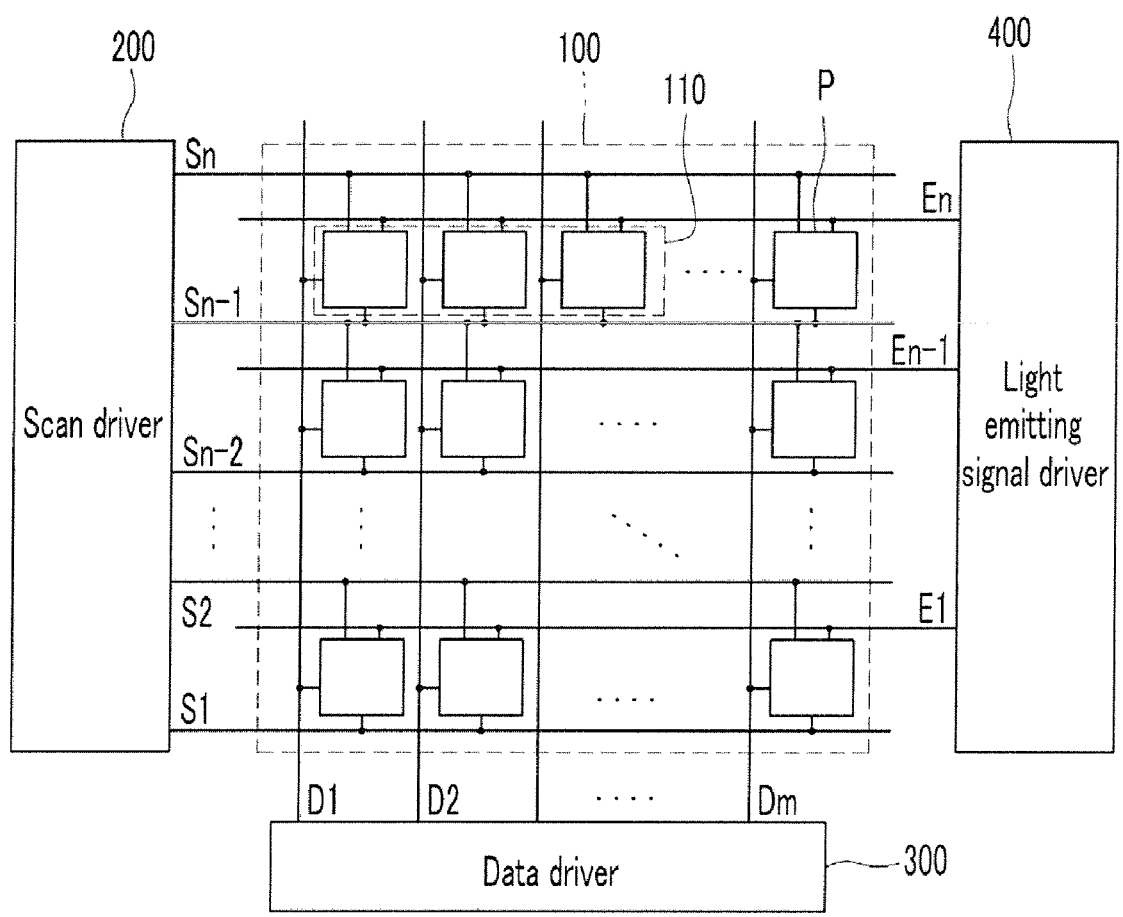
FIG. 1 is a schematic view of an OLED display according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

An embodiment of the present invention provides an OLED display having an electrode structure that can prevent a contact error of a dual-capacitor. In particular, an OLED display according to an embodiment of the present invention includes a substrate on which a transistor area and a capacitor area are defined, a semiconductor layer formed at the transistor area, and a capacitor having a plurality of electrodes. The plurality of electrodes include a first electrode, a second electrode that is disposed on the first electrode with an insulation layer formed between the first and second electrodes, and a third electrode that is disposed on the second electrode with an insulation layer formed between the second and third electrodes and connected to the first electrode through at least two contact holes.

Aspects of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to more clearly describe aspects of the present invention, a description of elements that are not related to the present invention will be omitted. Like reference numerals denote like elements throughout the drawings.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, a description that an element is "connected" to another element includes a case where the element is "directly connected" to another element and a case the element is "electrically connected" to another element with another element is interposed therebetween. Further, a description that a unit "includes" a constituent element indicates that the unit may further include other constituent elements in addition to the element, unless specifically referred to the contrary.

FIG. 1 is a schematic view of an OLED display according to an exemplary embodiment of the present invention. Referring to FIG. 1, an OLED display includes a display unit 100, a scan driver 200, a data driver 300, and a light emitting signal driver 400. The display unit 100 includes a plurality of data lines D1, D2 . . . , and Dm extending in a column direction, a plurality of scan lines S1, S2 . . . , and Sn extending in a row direction, a plurality of light emission control lines E1, E2 . . . , and En, and a plurality of pixels P.

The pixels P are red, green, and blue pixels. The pixels P are applied with respective data signals from the data driver 300. In more detail, the data lines D1, D2 . . . , and Dm transmit data signals representing image signals to the pixel circuit formed on each pixel P and the scan lines S1, S2 . . . , and Sn transmit selection signals to the pixel circuit.

The red, green, and blue pixels P have identical circuit structures. The red, green, and blue pixels P respectively emit red, green, and blue light corresponding to currents applied to the organic light emitting elements. Accordingly, a variety of colors are emitted by combining light emitted from the red, green, and blue pixels P forming color pixels 110 that are basic units for representing the image.

The scan driver 200 generates selection signals and sequentially applies the generated selection signals to the scan lines S1, S2 . . . , and Sn. Hereinafter, a scan line that transmits a current selection signal will be referred to as "current scan line." Further, a scan line that transmits a selection signal just before the current selection signal is transmitted will be referred to as "former scan line."

The data driver 300 generates data voltages Vdata corresponding to the image signals and applies the same to the data lines D1, D2 . . . , and Dm.

The light emission control driver 400 sequentially applies light emission control signals that control the light emission of the organic light emitting elements to the light emission control lines E1, E2 . . . , and En.

The scan driver 200, data driver 300, and/or light emission control driver 400 may be electrically connected to the display panel (not shown). Alternatively, the scan driver 200, data driver 300, and/or light emission control driver 400 may be provided in the form of chips that are mounted on a tape carrier package (TCP) electrically connected to the display panel. Alternatively, the scan driver 200, data driver 300, and/or light emission control driver 400 may be mounted on a flexible printed circuit (FPC) or a film that is electrically connected to the display panel.

As a further alternative, the driver 200, data driver 300 and/or light emission control driver 400 may be directly mounted on a glass substrate of the display panel. As a further alternative, the scan driver 200, data driver 300, and/or light emission control driver 400 may be replaced with a driving circuit formed on a layer identical to the scan lines, data lines, light emission control lines, and the TFTs, or may be directly mounted.

Figure 2:
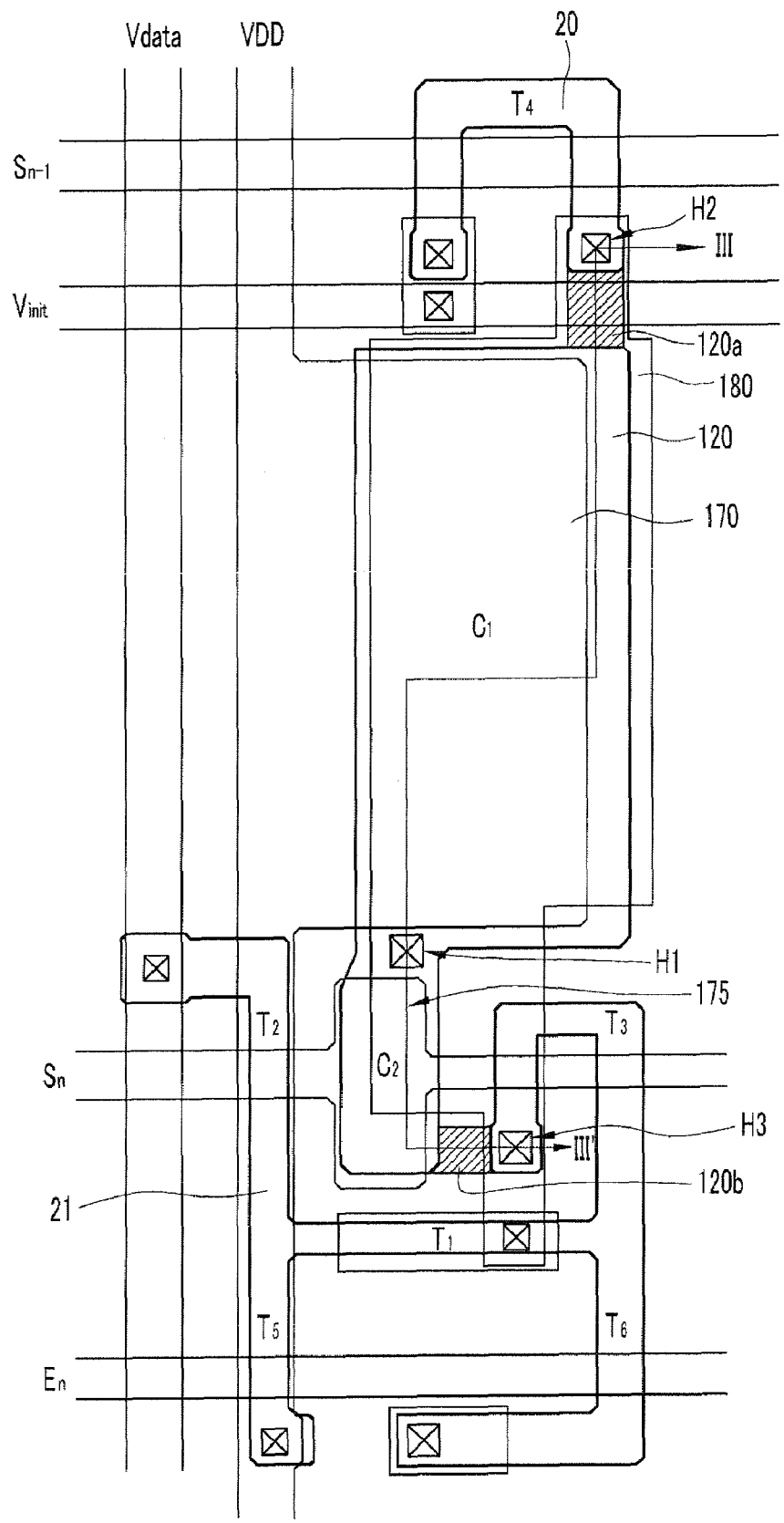
FIG. 2 is a schematic view of a layout of a major part of a pixel of FIG. 1.

FIG. 2 is a schematic view of a layout of a major part of one of the pixels of FIG. 1. Referring to FIG. 2, the pixel P includes former and current scan lines Sn−1 and Sn, a data line Vdata, a light emission control line En, first and second semiconductor layers 20 and 21 constituting a plurality of TFTs, and a plurality of electrodes 120, 170, 175, and 180 constituting capacitors C1 and C2.

The former scan line Sn−1, current scan line Sn, and light emission control line En are formed in parallel with each other. The lines are used as gate electrodes of the fourth, second, third, fifth, and sixth transistors T4, T2, T3, T5, and T6.

Further, the data line Dn and the common power line VDD extend to be perpendicular to the former scan line Sn−1, current scan line Sn, and light emission control line En.

Source and drain regions and a channel region are formed on the first and second semiconductor layers 20 and 21. The first semiconductor layer 20 constitutes the fourth transistor and the second semiconductor layer 21 constitute the first, second, third, fifth, and sixth transistors T1, T2, T3, T5, and T6.

The drain region of the first semiconductor layer 20 constituting the fourth transistor T4 is connected to an active pattern of the first capacitor C1 through a first extending pattern 120*a*.

In addition, the drain region of the third transistor T3 of the second semiconductor layer 21 is connected to the active pattern 120 of the second capacitor C2 through a second extending pattern 120*b*.

In the present embodiment of the present invention, each of the pixels P includes the two capacitors C1 and C2, and each of the capacitors C1 and C2 is formed as a dual-structure capacitor. The first electrode, the second electrode, and the third electrode are layered on one another with insulation layers interposed therebetween. The first and third electrodes contact each other to form a lower electrode, and the second electrode forms an upper electrode. A capacitor having such lower and upper electrodes is called a dual-structure capacitor.

In particular, in the first capacitor C1, the active pattern 120 functioning as the first electrode and the source/drain metal 180 functioning as the third electrode are connected to each other through a first contact hole H1 to form the lower electrode, and the gate pattern 170 functioning as the second electrode connected to the common power line VDD forms the upper electrode.

Further, as described above, the active pattern functioning as the first electrode of the first capacitor extends to be connected to the semiconductor layer included in the transistor connected between a power source VDD that supplies a power supply voltage and a power source Vinit that supplies an initial voltage. That is, the active pattern 120 is connected to the drain region of the fourth transistor T4. The active pattern 120 and the source/drain metal 180 are further connected to each other through a second contact hole H2.

Like the first capacitor C1, the second capacitor C2 includes a lower electrode formed by the connection of the active pattern 120 functioning as the first electrode with the source/drain metal 180 functioning as the third electrode through the first contact hole H1, and a second electrode formed by the gate pattern 175 functioning as the second electrode connected to the current scan line Sn.

As described above, the active pattern 120 functioning as the first electrode of the second capacitor extends to be connected to the semiconductor layer included in the transistor that transmits the data voltage to the driving transistor in response to the selection signal from the current scan line. That is, the active pattern 120 extends to be connected to the drain region of the third transistor T3. Further, the active pattern 120 and the source/drain metal 180 are further connected to each other through a third contact hole H3.

Meanwhile, in the present embodiment, the first and second capacitors C1 and C2 share the lower electrode with each other. However, the upper electrode is divided into two second electrodes 170 and 175 between which the first contact hole H1 is formed. One of the second electrodes 170 or 175 is connected to the power line VDD and the other of the second electrodes 170 or 175 is connected to the current scan line Sn.

As described above, the lower electrode shared by the first and second capacitors C1 and C2 is formed by two sections interconnected through at least two contact holes including the first contact hole H1. Therefore, the active pattern always functions as the lower electrode of the capacitors.

Figure 3:
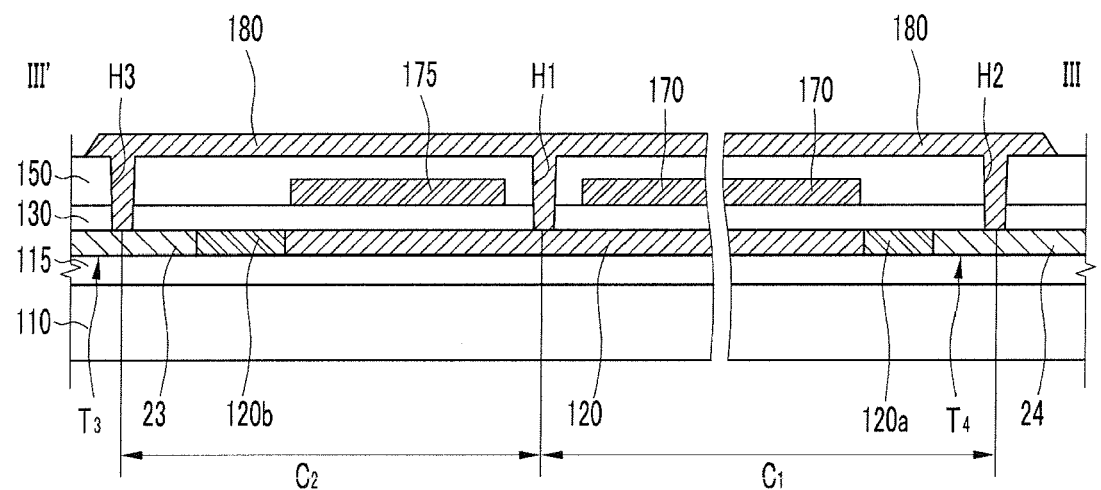
FIG. 3 is a sectional view taken along line III-III' of FIG. 2.

The following will describe a dual-structure of the capacitor of the OLED display in more detail. FIG. 3 is a sectional view taken along line III-III' of FIG. 2.

According to an embodiment of the present invention, a buffer layer 115 is formed on the substrate 110 and the drain regions 23 and 24, and the active pattern 120 of one of the semiconductor layers 20 and 21, which constitutes the third and fourth transistors T3 and T4, is formed on the buffer layer 115.

The active pattern 120 is connected to the drain region 23 of the semiconductor layer constituting the third transistor T3 and the drain region 24 of the semiconductor layer constituting the fourth transistor T4 by the respective first and second extending patterns 120*a* and 120*b*.

The first and second extending patterns 120*a* and 120*b* may be formed on the substrate in a process for forming the active pattern in the transistor or capacitor areas. Further, the first and second extending patterns 120*a* and 120*b* may be doped with impurities to minimize connection resistance. For example, the first and second extending patterns 120*a* and 120*b* may be doped with P$^+$ ions.

A gate insulation layer 130 is formed on the drain regions 23 and 24 of the semiconductor layer constituting the third and fourth transistors and the first and second extending patterns 120*a* and 120*b*. Further, the second electrodes 170 and 175 of the respective first and second capacitors C1 and C2 corresponding to the active pattern 120 are formed on the gate insulation layer 130 with the first contact hole H1 formed between the second electrodes 170 and 175.

An interlayer insulation layer 150 is formed on the gate insulation layer 130 and the second electrodes 170 and 175 of the respective first and second capacitors C1 and C2, and the source/drain metal 180 constituting the lower electrode shared by the first and second capacitors C1 and C2 is formed on the interlayer insulation layer 150.

The source/drain metal 180 is further connected to the active pattern 120 through the second and third contact holes H2 and H3 and the first and second extending patterns 120*a* and 120*b* as well as through the first contact hole H1. Accordingly, the lower electrode of the first and second capacitors C1 and C2, which is formed by the active pattern 120 and the source/drain metal 180, can be more securely formed.

Figure 4:
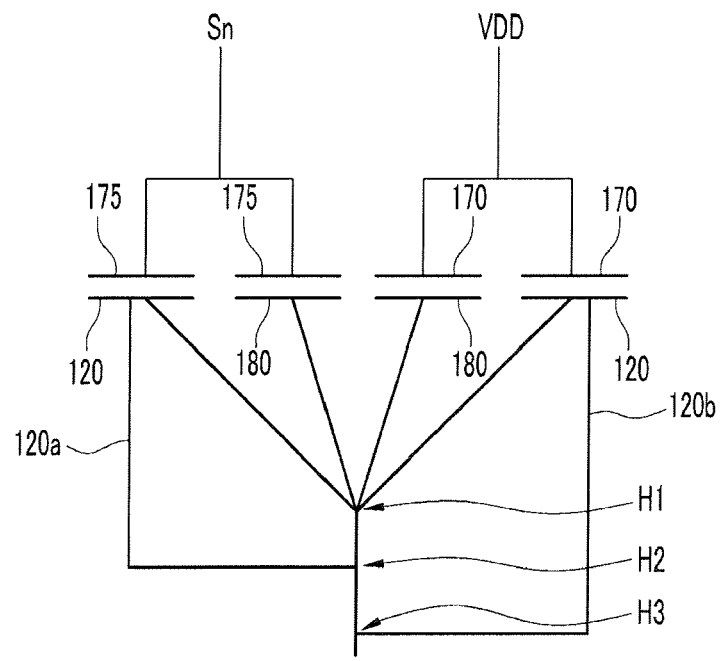
FIG. 4 is a schematic view of a contact structure and an equivalent structure of a dual-capacitor of FIG. 3.

FIG. 4 is a schematic view of a contact structure and an equivalent structure of the dual-capacitor of FIG. 3.

Referring to FIG. 4, the active pattern 120 and the source/drain metal 180, which constitute the lower electrode of the first and second capacitors C1 and C2, are electrically connected to each other through the first contact hole H1. Further, the first and second extending patterns 120a and 120b extending from the active pattern 120 are further connected to the source/drain metal 180 through the second and third contact holes H2 and H3.

As described above, the active pattern 120 may be connected to the source/drain metal 180 through the second and third contact holes H2 and H3.

Therefore, even when the first contact hole H1 is not successfully formed due to particles generated during a process for forming the active pattern 120 or when a portion of the active pattern 120 where the first contact hole H1 will be formed is eliminated, the active pattern 120 can be securely connected to the source/drain metal 180.

Accordingly, a reduction of the capacity of the capacitors, which may be caused when the first contact hole is not successfully formed such that the active pattern cannot function as the lower electrode, can be prevented. Further, the generation of a bright point or a dark point, which is caused by a proportional imbalance between the storage capacitor and the boost capacitor as the active pattern is eliminated during the forming of the contact hole, can be prevented.

The following will describe an operation of the OLED of the exemplary embodiment of the present invention with reference to the pixel circuit included in each pixel.

Figure 5:
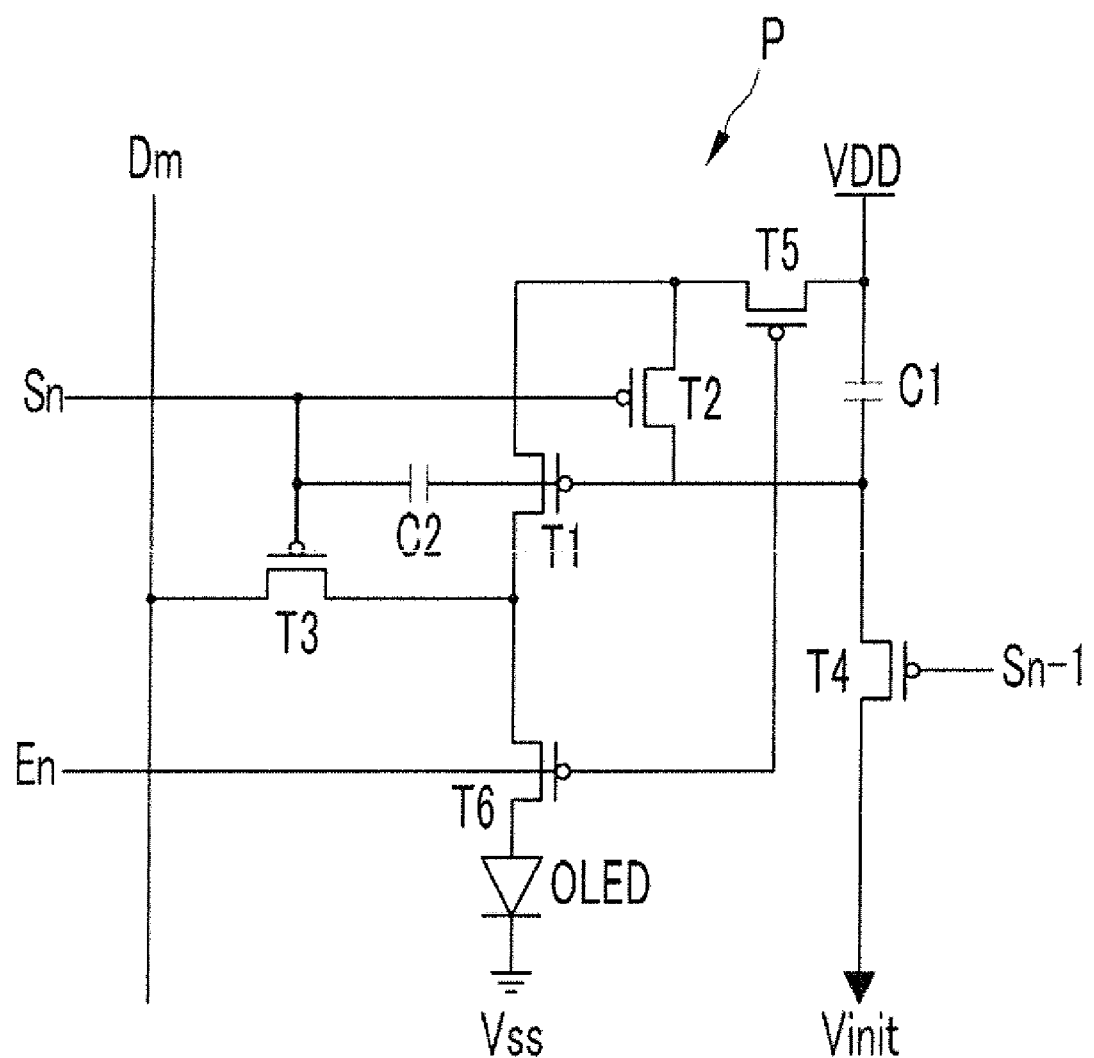
FIG. 5 is a circuit diagram of a pixel circuit for driving each pixel of FIG. 1.

FIG. 5 is a circuit diagram of a pixel circuit for driving each pixel P of FIG. 1.

Referring to FIG. 5, the pixel P includes an OLED, a data line Dm, former and current scan lines Sn−1 and Sn, a light emission control line En, and a driving circuit. The driving circuit is coupled to a line of the power source VDD and a line of the power source Vinit to generate a driving current by which the OLED emits light.

The OLED has a diode characteristic, including an anode, an organic thin film, and a cathode. Here, the anode is coupled to the driving circuit and the cathode is coupled to the power line VSS. The second power source VSS may apply a voltage that is lower than that applied by the power source VDD. For example, the second power source VSS may apply a ground voltage or a negative voltage. Therefore, the OLED emits light corresponding to the driving current applied from the driving circuit.

The driving circuit includes six transistors T1, T2, T3, T4, T5, and T6 and two capacitors C1 and C2. As non-limiting examples, the transistors may be P-type metal-oxide-semiconductor field effect transistors (MOSFETs). Each of the transistors has two electrodes forming source and drain electrodes, and a gate electrode.

The first transistor T1 is a driving transistor for driving the OLED. The first transistor T1 is connected between the power source VDD and the OLED and controls a current flowing along the OLED using an initial voltage applied from the power source Vinit to the gate.

The second transistor T2 is a switching transistor having a gate electrode connected to the current scan line Sn and a source electrode connected to the data line Dm. The second transistor T2 diode-connects the first transistor T1 by being turned on by the scan signal transmitted through the current scan line Sn.

The third transistor T3 is a threshold voltage compensation transistor. The third transistor T3 is connected between the data line Dm and the source electrode of the first transistor T1, and transmits a data voltage to the source electrode of the first transistor T1 in response to a scan signal transmitted through the scan line Sn.

The fourth transistor T4 is an initializing transistor. The fourth transistor T4 is connected between the power source Vinit and a first terminal of the first capacitor C1. The fourth transistor T4 transmits an initial voltage to the gate electrode of the first transistor T1 by being turned on in response to a scan signal of the former scan line Sn−1 connected to the gate electrode.

The fifth transistor T5 is a switching transistor. The fifth transistor T5 is connected between the power source VDD and the source electrode of the first transistor T1. The fifth transistor T5 applies a voltage to the source electrode of the first transistor T1 by being turned on in response to a light emission control signal transmitted through the light emission control line En connected to the gate electrode.

The sixth transistor T6 is a light emission control transistor. The sixth transistor T6 is connected between the first transistor T1 and the OLED, and transmits a driving current generated from the first transistor T1 to the OLED in response to a light emission signal transmitted through the light emission control line En connected to the gate electrode.

The first capacitor C1 is a storage capacitor and is connected between the fourth transistor T4 and the line of the power source VDD. When the fourth transistor T4 is turned on, a voltage difference (VDD-Vinit) between the voltage applied from the power source VDD and the initial voltage applied from the power source Vinit is charged in the first capacitor C1. The first capacitor C1 uniformly maintains a voltage between the gate electrode and the power source applying the voltage.

The second capacitor C2 has a first electrode connected to the current scan line Sn and a second electrode connected to the gate electrode of the first transistor T1. The second capacitor C2 maintains a voltage difference between a selection signal from the current scan line Sn and a gate of the first transistor T1 to be a predetermined level.

The OLED is connected between the drain electrode of the sixth transistor T6 and the second power source VSS.

With the above-described structure, a voltage corresponding to the data signal is stored in the second capacitor C2 as the data signal is applied, and the voltage stored in the second capacitor C2 is applied to the pixels as the scan signal is applied. As described above, since the voltage stored in the second capacitor C2 is simultaneously applied to each pixel, an image having uniform luminance can be realized.

In the exemplary embodiment of the present invention, although a case where six transistors and two capacitors are used is illustrated, the present invention is not limited to this embodiment. For example, more than two capacitors may be used.

According to the OLED display of the present invention, even when the contact hole of the dual-capacitor is blocked by particles generated during a manufacturing process, the connection between the active pattern and source/drain metal is maintained through additional contact holes and thus, a high capacity of the capacitor can be ensured. Therefore, the dark point problem can be solved.

Further, even when a portion of the active pattern where the first contact hole will be formed is eliminated due to the particles, the active pattern can be securely connected to the source/drain metal. Therefore, a ratio between a storage cap and a boost cap can be uniformly maintained and thus the generation of the bright point or dark point problem can be prevented.

In addition, the OLED display according to aspects of the present invention has a variety of traveling paths for the electrons and holes. Therefore, line resistance between the lines can be reduced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode display comprising:
   a substrate on which a transistor area and a capacitor area are defined;
   a semiconductor layer formed at the transistor area; and
   a capacitor having a plurality of electrodes,
   wherein the plurality of electrodes includes
      a first electrode,
      a second electrode that is disposed on the first electrode with an insulation layer formed between the first and second electrodes, and
      a third electrode that is disposed on the second electrode with an insulation layer formed between the second and third electrodes, the third electrode being connected to the first electrode through at least two contact holes, and
   wherein the second electrode is divided into two sections between which the contact hole formed through the capacitor area is located, and one of the two sections is connected to a line of a power source and the other of the two sections is connected to a current scan line.

2. The organic light emitting diode display of claim 1, wherein the first electrode is connected to the semiconductor layer formed at the transistor area.

3. The organic light emitting diode display of claim 2, wherein the first electrode is formed in an active pattern.

4. The organic light emitting diode display of claim 3, wherein the first electrode is connected to the semiconductor layer formed at the transistor area by an extending pattern.

5. The organic light emitting diode display of claim 4, wherein
   the extending pattern is doped with impurities.

6. The organic light emitting diode display of claim 2, wherein
   the semiconductor layer is included in a transistor coupled between a power source that supplies a power supply voltage and a power source that supplies an initial voltage.

7. The organic light emitting diode display of claim 2, wherein
   the semiconductor layer connected to the first electrode is included in a transistor that transmits a data voltage to a driving transistor in response to a selection signal applied from a current scan line.

8. The organic light emitting diode display of claim 1, wherein one of the at least two contact holes is formed through the capacitor area and at least one of the at least two contact holes is formed through the transistor area.

9. The organic light emitting diode display of claim 8, wherein at least two contact holes are formed through the transistor area.

10. The organic light emitting diode display of claim 9, wherein the contact holes formed through the transistor area are formed through portions of the semiconductor layer included in a transistor coupled between a power source that supplies a power supply voltage and a power source that supplies an initial voltage.

11. The organic light emitting diode display of claim 9, wherein the contact holes formed through the transistor area are formed through a transistor that transmits a data voltage to a driving transistor in response to a selection signal applied from a current scan line.

12. The organic light emitting diode display of claim 1, wherein the one of the two sections of the second electrode that is connected to the line of the power source forms a storage capacitor, and the other of the two sections that is connected to the current scan line forms a boost capacitor.

13. The organic light emitting diode display of claim 1, wherein the second electrode includes a metal.

14. The organic light emitting diode display of claim 8, wherein the third electrode is formed to cover the contact hole formed through the transistor area.

15. The organic light emitting diode display of claim 11, wherein the third electrode includes a metal.

16. The organic light emitting diode display of claim 1, wherein six transistors are formed at the transistor area and two capacitors are formed at the capacitor area.

* * * * *